United States Patent
Hino et al.

(10) Patent No.: US 11,011,546 B2
(45) Date of Patent: May 18, 2021

(54) SEMICONDUCTOR INTEGRATED CIRCUIT DEVICE

(71) Applicant: SOCIONEXT INC., Kanagawa (JP)

(72) Inventors: Toshio Hino, Yokohama (JP); Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/881,255

(22) Filed: May 22, 2020

(65) Prior Publication Data

US 2020/0286918 A1    Sep. 10, 2020

Related U.S. Application Data

(63) Continuation of application No. 16/228,319, filed on Dec. 20, 2018, now Pat. No. 10,700,095, which is a (Continued)

(30) Foreign Application Priority Data

Jul. 1, 2016  (JP) .............................. JP2016-131372

(51) Int. Cl.
*H01L 27/118* (2006.01)
*H01L 29/10* (2006.01)
(Continued)

(52) U.S. Cl.
CPC ........ *H01L 27/11807* (2013.01); *B82Y 10/00* (2013.01); *H01L 21/823821* (2013.01);
(Continued)

(58) Field of Classification Search
CPC ........... H01L 27/11807; H01L 29/4238; H01L 29/1079; H01L 21/823828; H01L 29/775;
(Continued)

(56) References Cited

U.S. PATENT DOCUMENTS 7,737,472 B2 * 6/2010 Kondo ................ H01L 27/0207
257/206
8,924,908 B2 * 12/2014 Kawa .................. H01L 23/5286
716/119
(Continued)

FOREIGN PATENT DOCUMENTS

JP    2008-258424 A    10/2008
JP    2015-019067 A     1/2015
(Continued)

OTHER PUBLICATIONS

International Search Report issued in International Patent Application No. PCT/JP2017/022878, dated Sep. 19, 2017; with partial English translation.
(Continued)

*Primary Examiner* — Vu A Vu
(74) *Attorney, Agent, or Firm* — McDermott Will and Emery LLP

(57) ABSTRACT

A semiconductor integrated circuit device including standard cells including fin transistors includes, at a cell row end, a cell-row-terminating cell that does not contribute to a logical function of a circuit block. The cell-row-terminating cell includes a plurality of fins extending in an X direction. Ends of the plurality of fins on the inner side of the circuit block are near a gate structure placed at a cell end and do not overlap with the gate structure in a plan view, and ends of the plurality of fins on an outer side of the circuit block overlap with any one of a gate structure in a plan view.

11 Claims, 10 Drawing Sheets

Related U.S. Application Data continuation of application No. PCT/JP2017/022878, filed on Jun. 21, 2017.

(51) Int. Cl.

| | | |
|---|---|---|
| *H01L 21/8238* | (2006.01) | |
| *H01L 29/775* | (2006.01) | |
| *H01L 29/08* | (2006.01) | |
| *B82Y 10/00* | (2011.01) | |
| *H01L 29/423* | (2006.01) | |
| *H01L 29/06* | (2006.01) | |
| *H01L 27/092* | (2006.01) | |
| *H01L 29/786* | (2006.01) | |
| *H01L 27/02* | (2006.01) | |

(52) U.S. Cl.
CPC .. *H01L 21/823828* (2013.01); *H01L 27/0207* (2013.01); *H01L 27/0924* (2013.01); *H01L 29/0673* (2013.01); *H01L 29/0696* (2013.01); *H01L 29/0847* (2013.01); *H01L 29/1079* (2013.01); *H01L 29/4238* (2013.01); *H01L 29/42392* (2013.01); *H01L 29/775* (2013.01); *H01L 29/78696* (2013.01); *H01L 2027/11864* (2013.01); *H01L 2027/11874* (2013.01)

(58) Field of Classification Search
CPC .......... H01L 29/0847; H01L 29/42392; H01L 21/823821; H01L 29/0696; H01L 29/0673; H01L 27/0924; H01L 29/78696; H01L 27/0207; H01L 2027/11864; H01L 2027/11874; B82Y 10/00
USPC ........................................................ 257/204
See application file for complete search history.

(56) References Cited

U.S. PATENT DOCUMENTS

| | | | |
|---|---|---|---|
| 9,257,439 B2* | 2/2016 | Liaw | ................... H01L 29/6681 |
| 2008/0246091 A1 | 10/2008 | Kondo et al. | |
| 2014/0167815 A1* | 6/2014 | Penzes | .................. G06F 30/392 |
| | | | 326/41 |
| 2015/0014775 A1 | 1/2015 | Seo et al. | |
| 2016/0049395 A1 | 2/2016 | Okagaki et al. | |
| 2016/0172351 A1 | 6/2016 | Shimbo | |

FOREIGN PATENT DOCUMENTS

| | | |
|---|---|---|
| JP | 2016-042568 A | 3/2016 |
| WO | 2015/029280 A1 | 3/2015 |

OTHER PUBLICATIONS

Notice of Allowance issued in U.S. Appl. No. 16/228,319, dated Jun. 8, 2020.

* cited by examiner

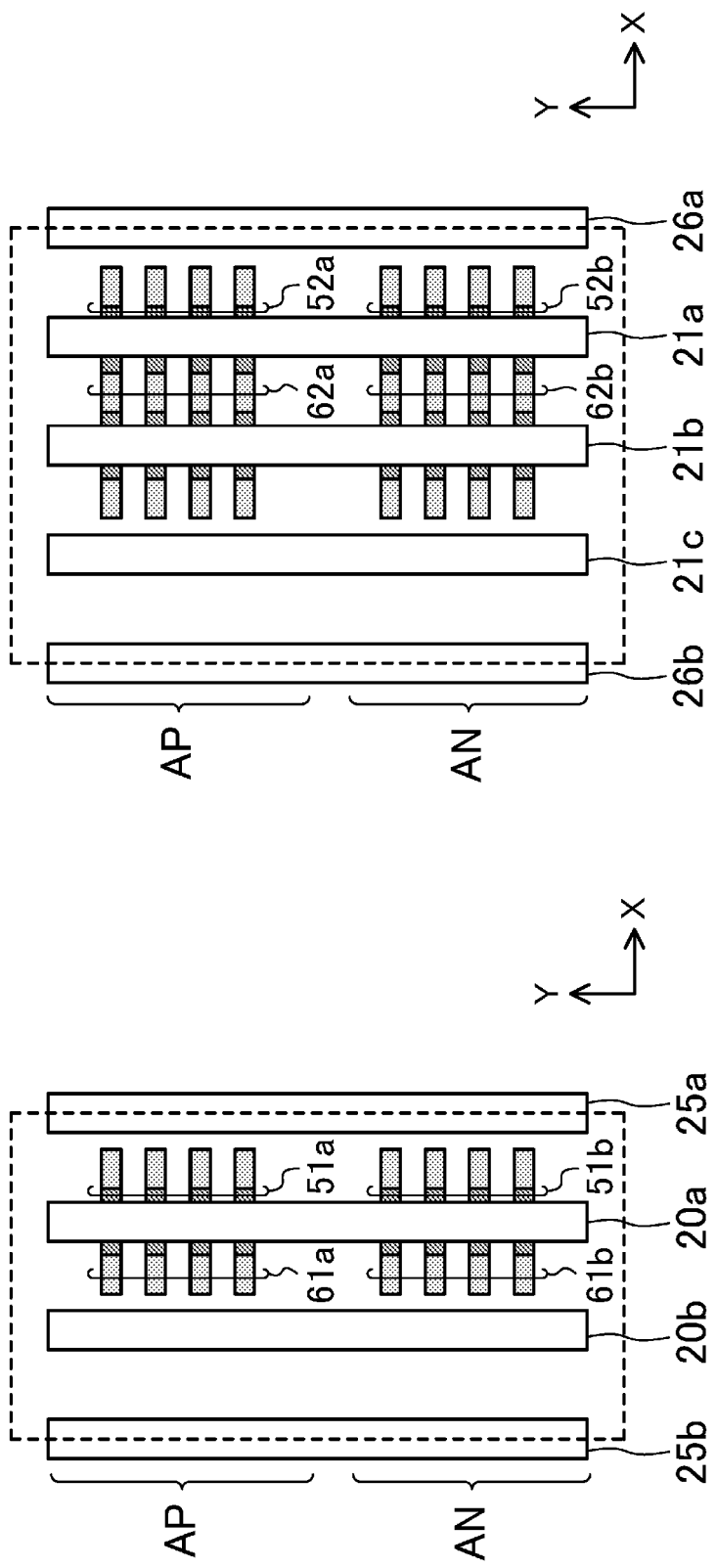

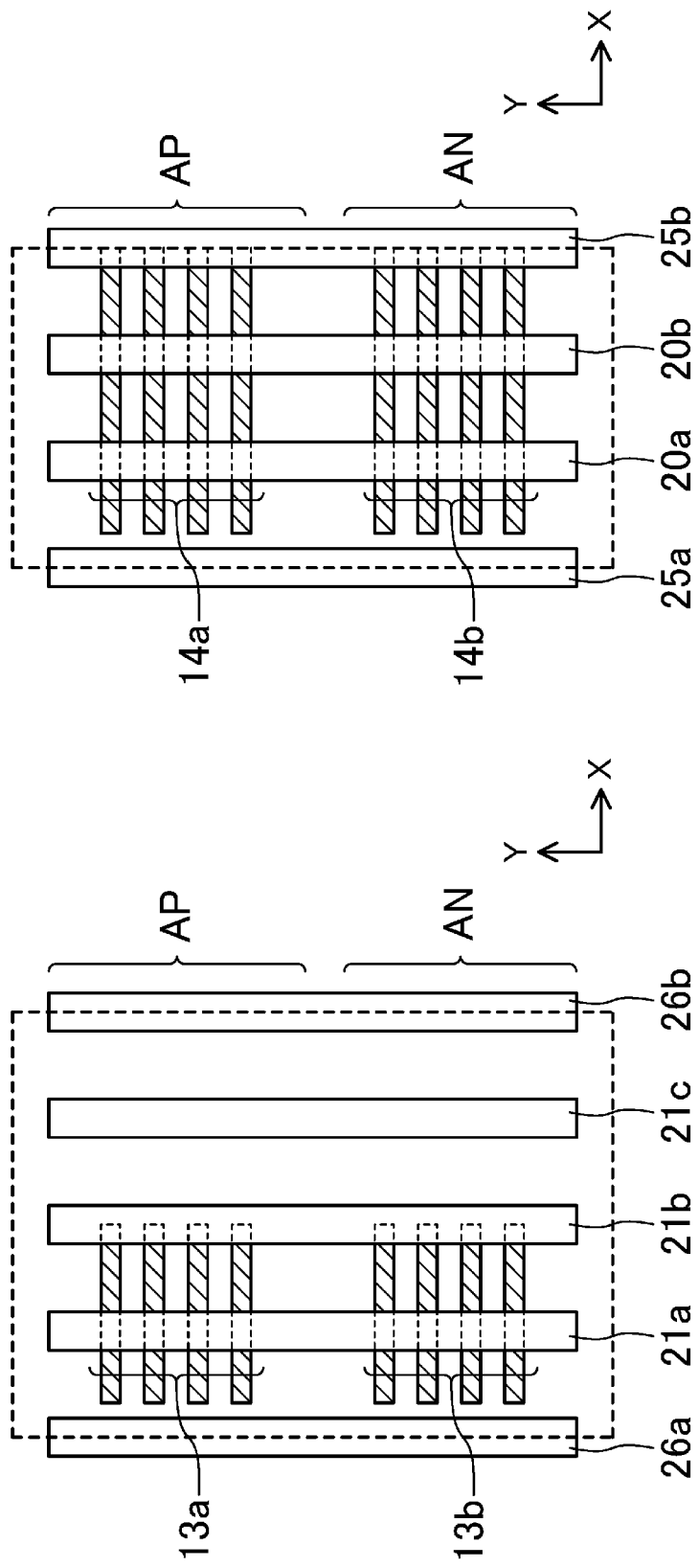

SEMICONDUCTOR INTEGRATED CIRCUIT DEVICE

CROSS-REFERENCE TO RELATED APPLICATION

This is a continuation application of U.S. patent application Ser. No. 16/228,319, filed on Dec. 20, 2018, which is a continuation of International Application No. PCT/JP2017/022878 filed on Jun. 21, 2017, which claims priority to Japanese Patent Application No. 2016-131372 filed on Jul. 1, 2016. The entire disclosures of these applications are incorporated by reference herein.

BACKGROUND

The present disclosure relates to a semiconductor integrated circuit device including standard cells (hereinafter, simply referred to as "cells" as appropriate) including fin structure transistors or nanowire field effect transistors (FETs).

A standard cell system is known as a method for forming a semiconductor integrated circuit on a semiconductor substrate. The standard cell system refers to a system in which an LSI chip is designed by preparing a basic unit having a specific logical function (an inverter, a latch, a flip-flop, a full adder, or any other component, for example) as a standard cell in advance, arranging a plurality of standard cells on a semiconductor substrate, and connecting the standard cells together through an interconnect.

In recent years, in the field of semiconductor devices, use of fin structure transistors (hereinafter, referred to as fin transistors) has been developed. FIG. 9 is a schematic diagram of an outline of a fin transistor. Unlike two-dimensional structure metal oxide semiconductor (MOS) transistors, a source and a drain of a fin transistor have a bulging three-dimensional structure called a fin. A gate is placed to surround this fin. This fin structure causes a channel region to be formed by three faces of the fin and thus allows channel controllability to be much higher than ever before. Consequently, effects such as a reduction in leakage power, improvement in on-state current, and a reduction in operating voltage are obtained, and the performance of the semiconductor integrated circuit improves. Attention is also being given to nanowire FETs as one of the three-dimensional structure transistors.

United States Patent Publication No. 2014/0167815 (FIG. 4) discloses a configuration of a filler cell used for filling the gap between each adjacent pair of cells. This filler cell has a fin structure having two ends that each terminate between an associated pair of gates.

SUMMARY

The characteristics of fin transistors are influenced by the distance to an adjacent transistor more strongly than those of two-dimensional structure MOS transistors. Current characteristics fluctuate by OD-spacing-effect (OSE) corresponding to the distance to another fin or changes in physical stress, for example. A fin bulges from a substrate surface, and its capacitance characteristics also fluctuate in accordance with the distance to another fin. In other words, fin transistors change in current characteristics and capacitance characteristics according to the distance to the adjacent transistor.

In a standard cell system, relative to a standard cell, the configuration of an adjacent standard cell varies. Consequently, a fin transistor placed near a cell end variously changes in distance to an adjacent fin according to the configuration of the adjacent standard cell, for example. A standard cell placed at a cell row end of a circuit block can exceedingly increase in the distance to the adjacent fin, for example. Thus, when the characteristics of fin transistors significantly change according to the arrangement of cells, a certain margin needs to be given to current and capacitance with this change taken into account in advance. This need may lead to a reduction in the performance of a semiconductor integrated circuit and an increase in cost, which is unfavorable.

It is an object of the present disclosure to stabilize transistor characteristics while reducing process-induced variations at cell row ends of a circuit block in a semiconductor integrated circuit device including standard cells including fin transistors or nanowire FETs.

In an aspect of the present disclosure, a semiconductor integrated circuit device includes a circuit block having a plurality of cell rows each having a plurality of cells arranged in a first direction, the cell rows being arranged in a second direction perpendicular to the first direction. In the circuit block, at least one of the cell rows includes, at at least one end thereof, a cell-row-terminating cell that does not contribute to a logical function of the circuit block, the cell-row-terminating cell includes: a plurality of fins extending in the first direction; and a plurality of gate structures extending in the second direction and including a first gate structure placed at a cell end on an inner side of the circuit block, and ends of the plurality of fins on the inner side of the circuit block do not overlap with the first gate structure in a plan view, and ends of the plurality of fins on an outer side of the circuit block overlap with any one of the gate structures other than the first gate structure in a plan view.

According to this aspect, in the circuit block of the semiconductor integrated circuit device, an end portion of the cell row includes the cell-row-terminating cell that does not contribute to the logical function of the circuit block. The presence of this cell-row-terminating cell can stabilize transistor characteristics near the cell row end. The cell-row-terminating cell includes a plurality of fins extending in the first direction, and the end of each fin on the inner side of the circuit block is near the gate structure placed at a cell end and does not overlap with this gate structure in a plan view. With this configuration, the cell-row-terminating cell can be placed adjacent to the next cell without having excessive space relative thereto, and the area of the circuit block can thus be reduced to a lower degree. In addition, the characteristics of fin transistors of the next cell can be stabilized. The end of each fin of the cell-row-terminating cell on the outer side of the circuit block overlaps with a gate structure other than the first gate structure in a plan view, i.e., under the gate structure. With this configuration, process-induced variations in fin shape can be reduced. Consequently, transistor characteristics can be stabilized while process-induced variations at the cell row end of the circuit block are reduced.

In another aspect of the present disclosure, a semiconductor integrated circuit device comprising a circuit block having a plurality of cell rows each having a plurality of cells arranged in a first direction, the cell rows being arranged in a second direction perpendicular to the first direction. The circuit block includes a rectangular area including a plurality of cell rows each having a first end and a second end, the first ends of the cell rows in the first direction being aligned, the second ends of the cell rows in the first direction being aligned, a plurality of cell-row-terminating cells that do not contribute to a logical function of the circuit block are each disposed in one end of an associated one of the cell rows included in the rectangular area, the cell-row-terminating cells each include: a plurality of nanowires extending in the first direction; a plurality of pads connected to the nanowires; and a plurality of gate structures extending in the second direction and including a first gate structure placed at a cell end on an inner side of the circuit block, and ends of the plurality of pads on the inner side of the circuit block do not overlap with the first gate structure in a plan view, and the cell-row-terminating cells include a plurality of kinds of cells having different cell widths, the cell widths corresponding to a cell dimension in the first direction.

In this aspect, in the circuit block of the semiconductor integrated circuit device, a cell row end includes the cell-row-terminating cell that does not contribute to the logical function of the circuit block. The presence of this cell-row-terminating cell can stabilize transistor characteristics near the cell row end. The cell-row-terminating cell includes a plurality of nanowires extending in the first direction and a plurality of pads connected to the nanowires. The ends of the pads on the inner side of the circuit block are near the gate structure placed at the cell end and do not overlap with the gate structure in a plan view. With this configuration, the cell-row-terminating cell can be placed adjacent to the next cell without having excessive space relative thereto, and the area of the circuit block can thus be reduced. The cell-row-terminating cells include a plurality of kinds of cells having different cell widths, and the position of a boundary between the cell-row-terminating cell and the adjacent cell shifts in the first direction. With this configuration, in a manufacturing process, narrow portions with no nanowire that are continuously arranged in the second direction at the boundary between the cell-row-terminating cell and the next cell can be substantially prevented from being excessively long. Consequently, process-induced variations in nanowire FETs can be reduced.

The present disclosure can stabilize transistor characteristics while reducing process-induced variations at cell row ends of a circuit block in a semiconductor integrated circuit device including standard cells including fin transistors or nanowire FETs.

BRIEF DESCRIPTION OF THE DRAWINGS

FIG. 3A is a plan view of a layout configuration of the cell-row-terminating cell; and FIG. 3B is a cross-sectional view thereof.

FIG. 6A is a plan view of a layout configuration of the cell-row-terminating cell; and FIG. 6B is a cross-sectional view thereof.

FIGS. 7A and 7B are plan views of other examples of the layout configuration of the cell-row-terminating cell of the second embodiment.

FIGS. 8A and 8B are plan views of other examples of the layout configuration of the cell-row-terminating cell of the first embodiment.

DETAILED DESCRIPTION

Embodiments will now be described with reference to the accompanying drawings.

First Embodiment

In a first embodiment, a semiconductor integrated circuit device includes a plurality of standard cells, in which at least some of the standard cells include fin transistors.

Figure 1:
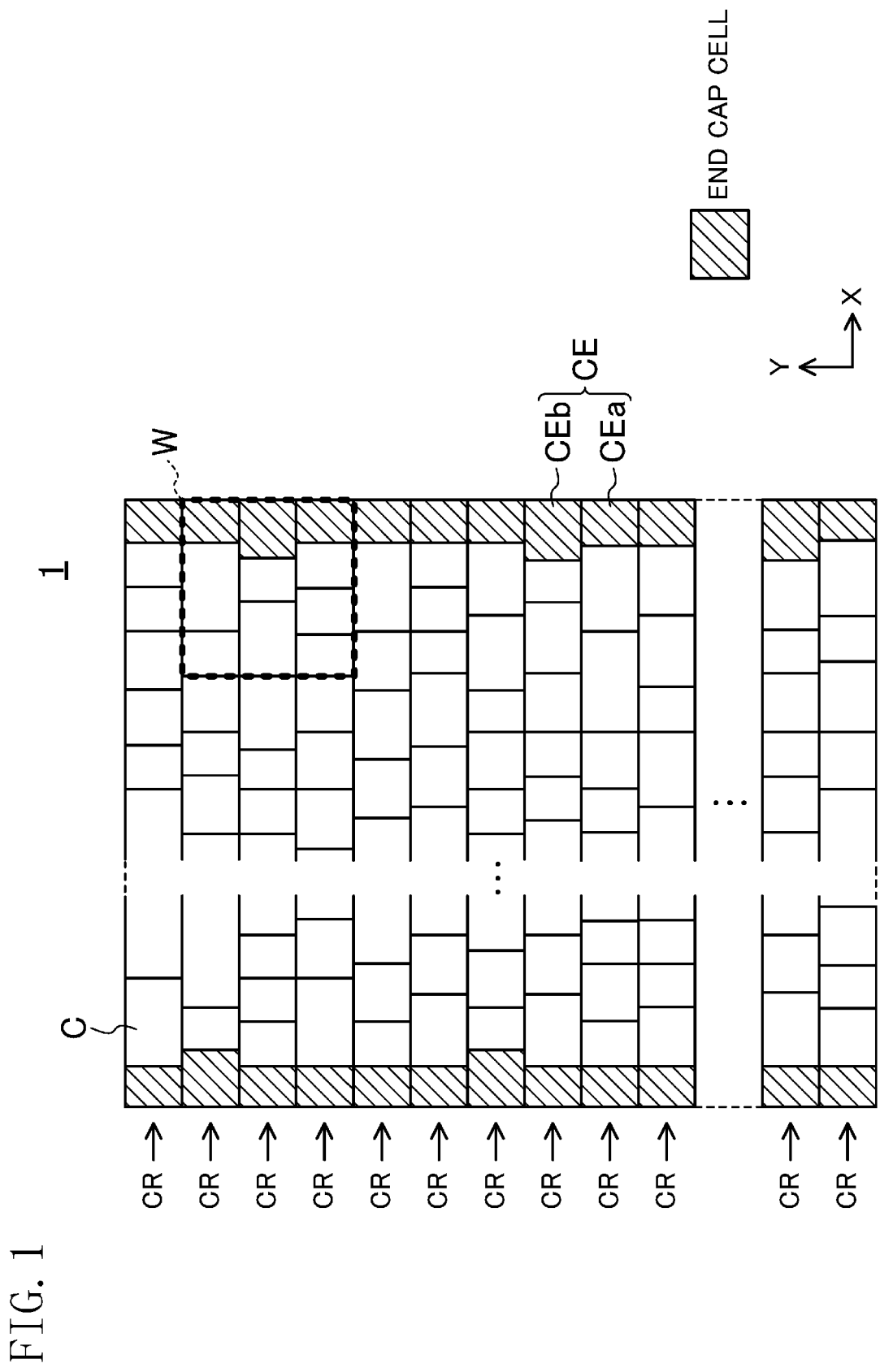
FIG. 1 is a schematic plan view of a layout example of a circuit block of a semiconductor integrated circuit device according to an embodiment.

FIG. 1 is a schematic plan view of a layout example of a circuit block of a semiconductor integrated circuit device according to an embodiment. In this circuit block 1 in FIG. 1, a plurality of cells C arranged in an X direction (the lateral direction in the drawing corresponding to a first direction) form a cell row CR. A plurality of cell rows CR are arranged in a Y direction (the longitudinal direction in the drawing corresponding to a second direction). FIG. 1 illustrates only the cell frame of each of the cells C and does not illustrate internal components such as gates and fins.

In the layout in FIG. 1, the circuit block 1 has a rectangular outer shape, and the cell rows CR have two ends in the X direction. First ends of the cell rows CR are aligned while second ends of the cell rows CR are also aligned. Both end portions of each of the cell rows CR include cell-row-terminating cells (also referred to as End Cap cells) CE, respectively. In FIG. 1, the cell-row-terminating cells CE are hatched. In this example, the "cell-row-terminating cells" refer to cells that do not contribute to a logical function of the circuit block 1 and are used to terminate the associated cell rows CR. Arranging the cell-row-terminating cells CE can sufficiently widen a well region of the cell row CR in the X direction. With this configuration, transistors of cells contributing to the logical function and located inside the cell-row-terminating cells CE are kept away from a well end, and fluctuations in transistor characteristics near the well end can be reduced.

In the layout in FIG. 1, the cell-row-terminating cells CE include first cell-row-terminating cells CEa and second cell-row-terminating cells CEb. The first and second cell-row-terminating cells CEa and CEb have different cell widths (i.e., a dimension in the X direction). The circuit block 1 may include some cells that do not contribute to the logical function of the circuit block 1 such as a filler cell other than the cell-row-terminating cells CE.

Figure 2:
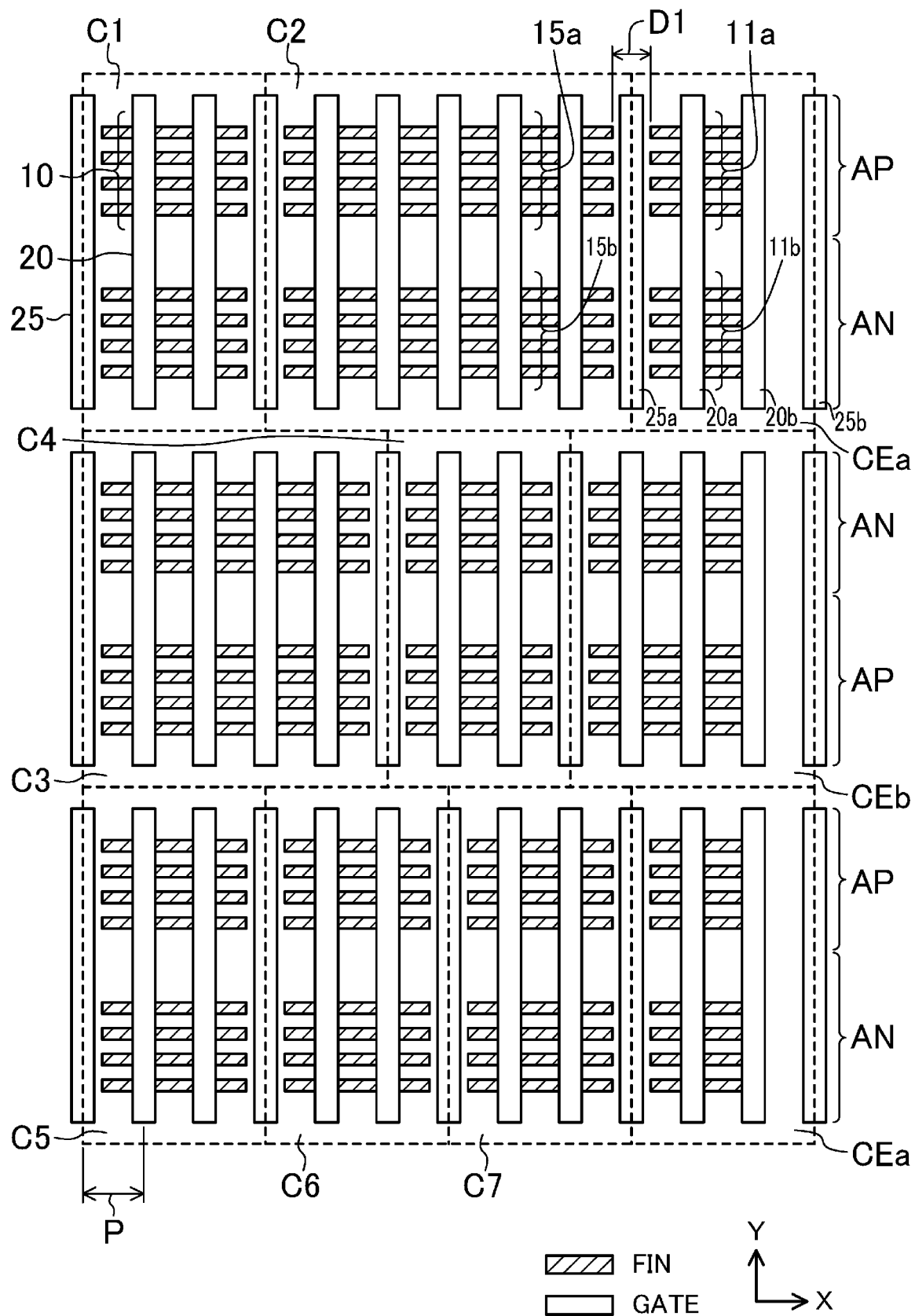
FIG. 2 is a partially enlarged view of FIG. 1 according to a first embodiment.

FIG. 2 is an enlarged view of a portion W of FIG. 1 according to the present embodiment. FIG. 2 illustrates fins 10 and gate structures including gates 20 and dummy gates 25 in addition to cell frames (indicated by the broken line). However, other components such as a metal interconnect is not illustrated. In this example, the "dummy gate" refers to a gate that is not formed on the fins 10 and does not form a fin transistor. In FIG. 2, the fins 10 are hatched to allow the reader to find the fins easily (the same for FIGS. 3A to 4B, and 8A and 8B). C1 to C7 are cells that contribute to the logical function of the circuit block 1. A cell row on the upper side of the drawing includes the cells C1 and C2, and a first cell-row-terminating cell CEa disposed at its end on the right side of the drawing. A cell row at the center of the drawing includes the cells C3 and C4, and a second cell-row-terminating cell CEb disposed at its end on the right side of the drawing. A cell row on the lower side of the drawing includes the cells C5 to C7, and a first cell-row-terminating cell CEa disposed at its end on the right side of the drawing.

In FIG. 2, the fins 10 are arranged to extend in the X direction, whereas the gates 20 and the dummy gates 25 are arranged to extend in the Y direction. The fins 10 and the gates 20 formed on the fins 10 form fin transistors. In each of the cell rows, AP denotes a P-type transistor area, whereas AN denotes an N-type transistor area. An upper portion of each of the first and third cell rows from the top is the P-type transistor area AP, whereas a lower portion thereof is the N-type transistor area AN. A lower portion of the second cell row from the top is the P-type transistor area AP, whereas an upper portion thereof is the N-type transistor area AN. In each of the P-type transistor area AP and the N-type transistor area AN, sets of four of the fins 10 are obtained, and the four fins 10 are arranged side by side. The dummy gates 25 are arranged at cell ends. The gate structures including the gates 20 and the dummy gates 25 are arranged at a uniform pitch P. The cell width of the first cell-row-terminating cell CEa is P×3, whereas the cell width of the second cell-row-terminating cell CEb is P×4.

Figure 3A:
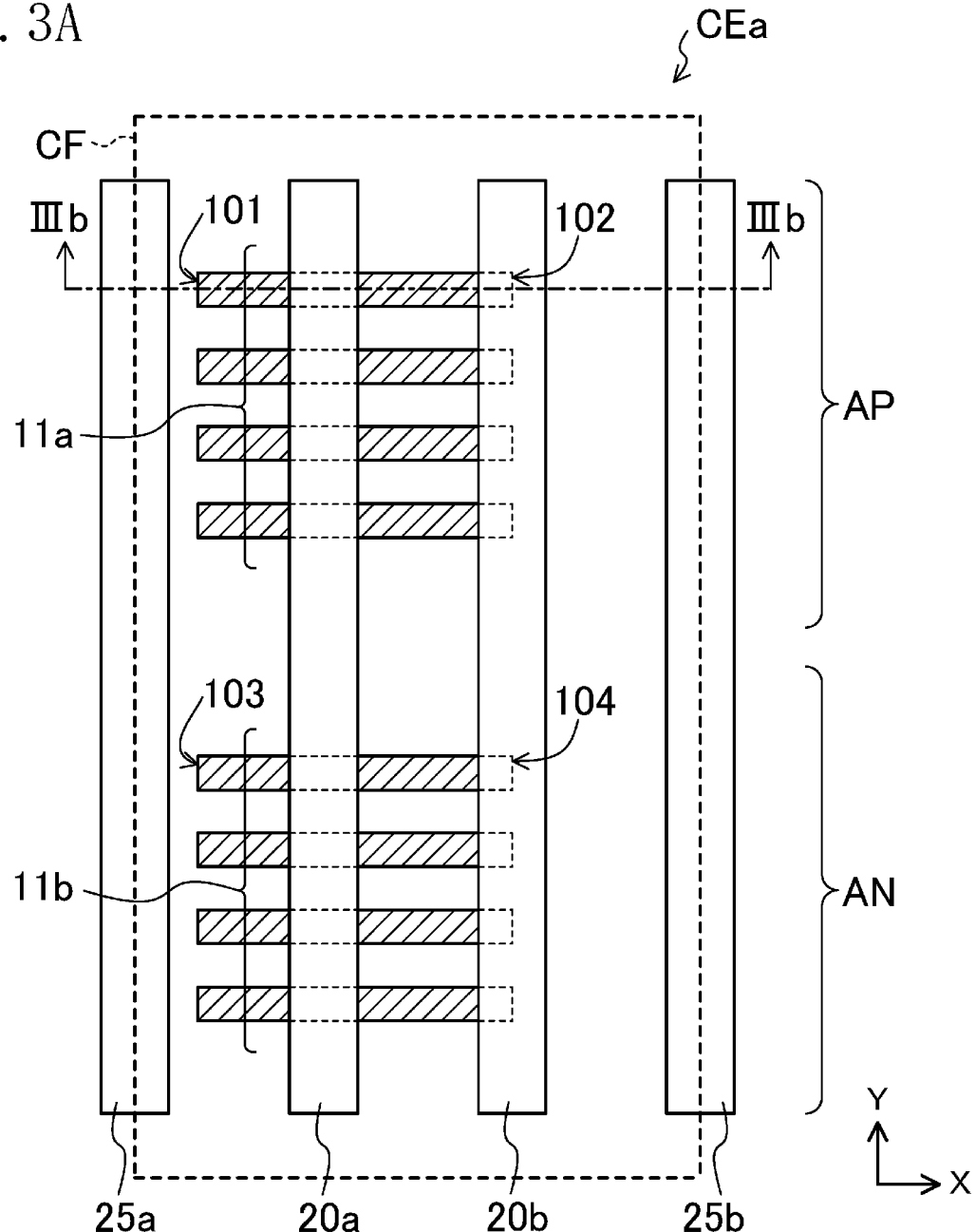
FIGS. 3A and 3B illustrate a configuration example of a cell-row-terminating cell of the first embodiment.
Figure 3B:
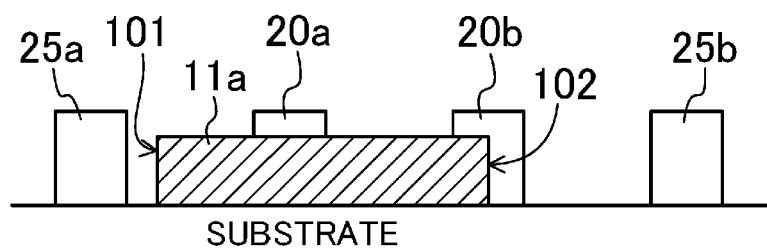

FIGS. 3A and 3B illustrate a configuration example of the first cell-row-terminating cell CEa. FIG. 3A is a plan view of a layout configuration thereof; and FIG. 3B is a cross-sectional view taken along line IIIb-IIIb shown in FIG. 3A. CF denotes a cell frame. The P-type transistor area AP is formed with four fins 11a, whereas the N-type transistor area AN is formed with four fins 11b. Within the cell, two gate structures 20a and 20b are formed, and gate structures 25a and 25b as dummy gates are respectively formed at both cell ends in the X direction.

Here, ends 101 of the fins 11a on the left side of the drawing are located in front of the gate structure 25a, whereas ends 102 thereof on the right side of the drawing are located under the gate structure 20b. In other words, the ends 101 are near the gate structure 25a and do not overlap with the gate structure 25a in a plan view, whereas the ends 102 overlap with the gate structure 20b in a plan view. Similarly, ends 103 of the fins 11b on the left side of the drawing are located in front of the gate structure 25a, whereas ends 104 thereof on the right side of the drawing are located under the gate structure 20b. In other words, the ends 103 are near the gate structure 25a and do not overlap with the gate structure 25a in a plan view, whereas the ends 104 overlap with the gate structure 20b in a plan view. The first cell-row-terminating cell CEa is placed at the end of the cell row CR on the right side of the drawing as illustrated in FIGS. 1 and 2, and in FIGS. 3A and 3B, the left side of the drawing corresponds to an inner side of the circuit block 1, whereas the right side of the drawing corresponds to an outer side of the circuit block 1.

The second cell-row-terminating cell CEb has a larger cell width by one pitch P between the gate structures than the first cell-row-terminating cell CEa. However, its basic configuration is similar to that in FIG. 3.

Referring back to FIG. 2, in the cell row on the upper side of the drawing, the cell C2 is adjacent to the first cell-row-terminating cell CEa on the left side of the drawing. The cell C2 includes a plurality of (four in this example) fins 15a extending in the X direction in the P-type transistor area AP. The fins 15a face the respective fins 11a of the first cell-row-terminating cell CEa. The distances D1 between the fins 15a and the facing fins 11a are equal. The cell C2 includes a plurality of (four in this example) fins 15b extending in the X direction in the N-type transistor area AN. The fins 15b face the respective fins 11b of the first cell-row-terminating cell CEa. The distances D1 between the fins 15b and the facing fins 11b are equal. The same applies to the relation between the cell C4 and the second cell-row-terminating cell CEb in the cell row at the center of the drawing and the relation between the cell C7 and the first cell-row-terminating cell CEa in the cell row on the lower side of the drawing.

The positional relation between a fin end and a gate structure will be additionally described.

The pattern of the terminal position of the fin end is broadly divided into two kinds, i.e., the pattern 1) in which the fin end is terminated in front of the gate structure and the pattern 2) in which the fin end is terminated under the gate structure. In the layout in FIG. 2, most of the fin ends fall under the pattern 1). That is, most of the fin ends terminate in front of the gate structure and do not overlap with the gate structure in a plan view. However, an end of each of the cell-row-terminating cells CEa and CEb on the outer side of the circuit block (the right side of the drawing) falls under the pattern 2). That is, the end terminates under the gate structure.

In the pattern 1), only one gate is interposed between each adjacent pair of fin ends, and the distance therebetween is a minute distance shorter than the gate pitch. Consequently, when the pattern 1) is employed, the area of the circuit block can be reduced, and the fins of the adjacent pair of the cells face each other with the same minute distance therebetween, thus improving the accuracy of predicting transistor characteristics. In contrast, in the pattern 2), the distance between fin ends is the gate pitch or an integer multiple of the gate pitch, which is relatively large. Consequently, when the pattern 2) is employed, the reduction in the area of the circuit block is hindered, and the fin-to-fin distance may be uncertain between adjacent cells. This makes it difficult to predict transistor characteristics.

In a manufacturing process, after the fins are first formed on the entire circuit block, unnecessary portions of the fins are removed using a mask. In this process, the distance between fin ends that terminate in the pattern 2) is large, and the portions of the fins can thus be removed with high precision. In contrast, the distance between fin ends that terminate in the pattern 1) is narrow, and the portions of the fins are removed with low precision, resulting in large variations. In other words, the process-induced variations are likely to occur in fin shape.

With this being the case, using the first cell-row-terminating cell CEa with the configuration illustrated in FIG. 3 can provide the following effects. Specifically, the ends 101 of the fins 11a and the ends 103 of the fins 11b of the first cell-row-terminating cell CEa on the inner side of the circuit block 1 are near the gate structure 25a placed at a cell end and do not overlap with the gate structure 25a in a plan view. With this configuration, the first cell-row-terminating cell CEa can be placed adjacent to the next cell C2 without having excessive space relative thereto, and the area of the circuit block 1 can thus be reduced to a lower degree. As illustrated in FIG. 2, in the next cell C2, the fins 15a face the fins 11a of the first cell-row-terminating cell CEa, respectively, whereas the fins 15b face the fins 11b of the first cell-row-terminating cell CEa, respectively. With this configuration, the characteristics of the fin transistors of the cell C2 are stabilized. The ends 102 of the fins 11a and the ends 104 of the fins 11b of the first cell-row-terminating cell CEa on the outer side of the circuit block 1 overlap with the gate structure 20b in a plan view. With this configuration, process-induced variations in fin shape can be reduced. Similar effects can be obtained by the second cell-row-terminating cell CEb.

FIGS. 2, 3A, and 3B illustrate the layout example of the cell-row-terminating cell placed at the end of the cell row CR on the right side of the drawing. The cell-row-terminating cell placed at the end of the cell row CR on the left side of each of the drawings is a mirror image of the cell-row-terminating cell placed at the end of the cell row on the right side of the drawing, for example.

Figure 4A:
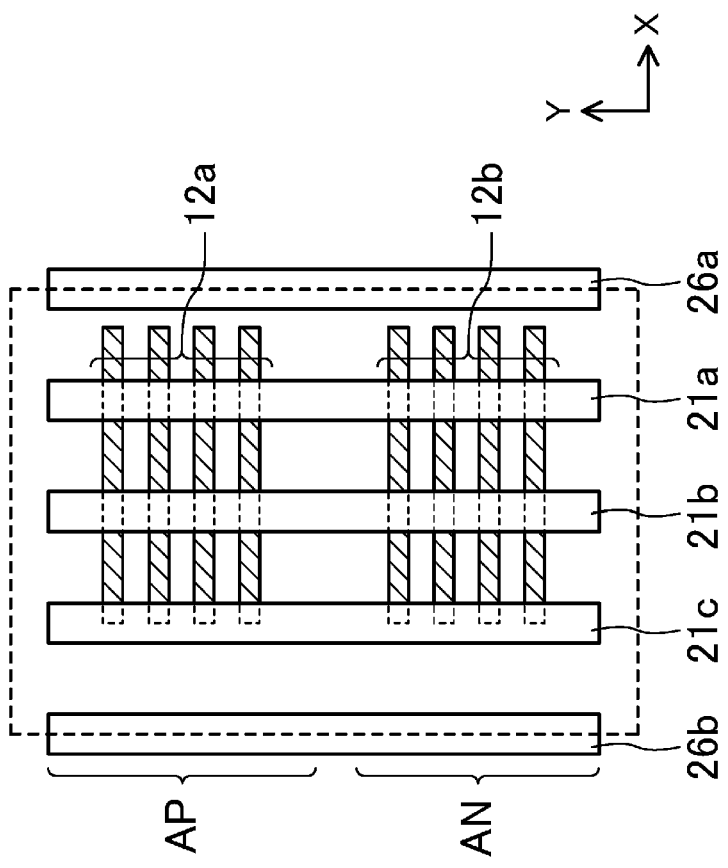
FIGS. 4A and 4B are plan views of other examples of the layout configuration of the cell-row-terminating cell of the first embodiment.
Figure 4B:
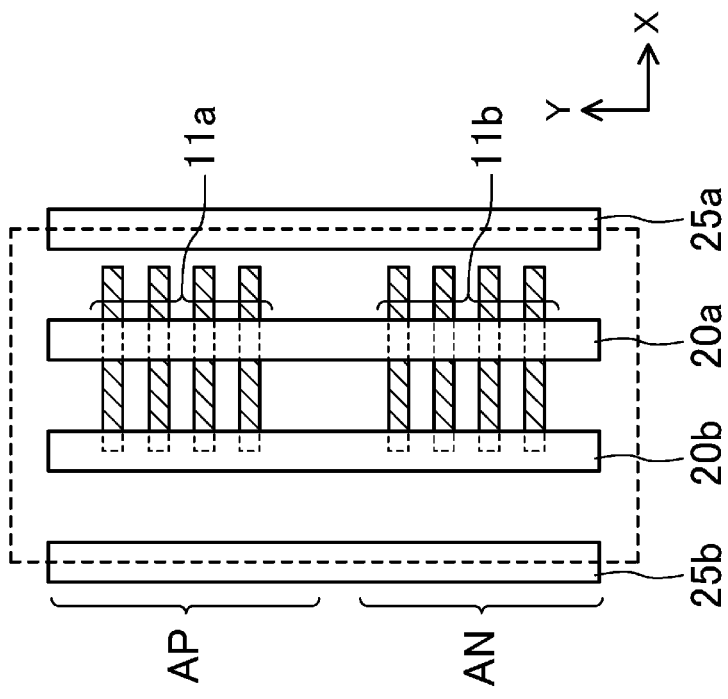

FIGS. 4A to 4B illustrate other examples of the layout configuration of the cell-row-terminating cell and illustrate the configuration of the cell-row-terminating cell placed at the end of the cell row CR on the left side of the drawing. In FIGS. 4A and 4B, the left side of each of the drawings corresponds to the outer side of the circuit block 1, whereas the right side of the drawing corresponds to the inner side of the circuit block 1.

The configuration in FIG. 4A corresponds to a mirror image of the configuration in FIG. 3A. In other words, the P-type transistor area AP includes the four fins 11a, whereas the N-type transistor area AN includes the four fins 11b. Within the cell, the two gate structures 20a and 20b are formed, and the gate structures 25a and 25b are formed at both cell ends in the X direction, respectively. The ends of the fins 11a and 11b on the right side of the drawing are located in front of the gate structure 25a, whereas the ends on the left side of the drawing are located under the gate structure 20b.

The configuration in FIG. 4B is obtained by increasing the cell width of the configuration in FIG. 4A by one pitch P between the gate structures. In other words, the P-type transistor area AP includes four fins 12a, whereas the N-type transistor area AN includes four fins 12b. Within the cell, three gate structures 21a, 21b, and 21c are formed, and gate structures 26a and 26b are formed at both cell ends in the X direction, respectively. Ends of the fins 12a and 12b on the right side of the drawing are located in front of the gate structure 26a, whereas ends on the left side of the drawing are located under the gate structure 21c.

In the present embodiment, as illustrated in FIG. 1, all the cell-row-terminating cells CE placed at the respective one ends of the cell rows CR do not have the same cell width, and include a plurality of kinds of cell-row-terminating cells CEa and CEb having different cell widths. Consequently, the position of a boundary between the cell-row-terminating cell CE and the next cell is not the same but shifts in the X direction. With this configuration, in a manufacturing process, narrow portions of the fins which is to be removed and which are continuously arranged in the Y direction at the boundary between the cell-row-terminating cell CE and the next cell can be substantially prevented from being excessively long. Consequently, process-induced variations in fin shape can be reduced.

As illustrated in FIG. 1, the second cell-row-terminating cells CEb each having a cell width that is different from that of the first cell-row-terminating cells CEa may be arranged at every certain number of cell rows (at every five rows, for example). With this configuration, the regularity of the layout increases, and process-induced variations can be further reduced. The second cell-row-terminating cells CEb do not necessarily have to be arranged at regular intervals.

Second Embodiment

In a second embodiment, a semiconductor integrated circuit device includes a plurality of standard cells, at least some of which include nanowire FETs.

Figure 10:
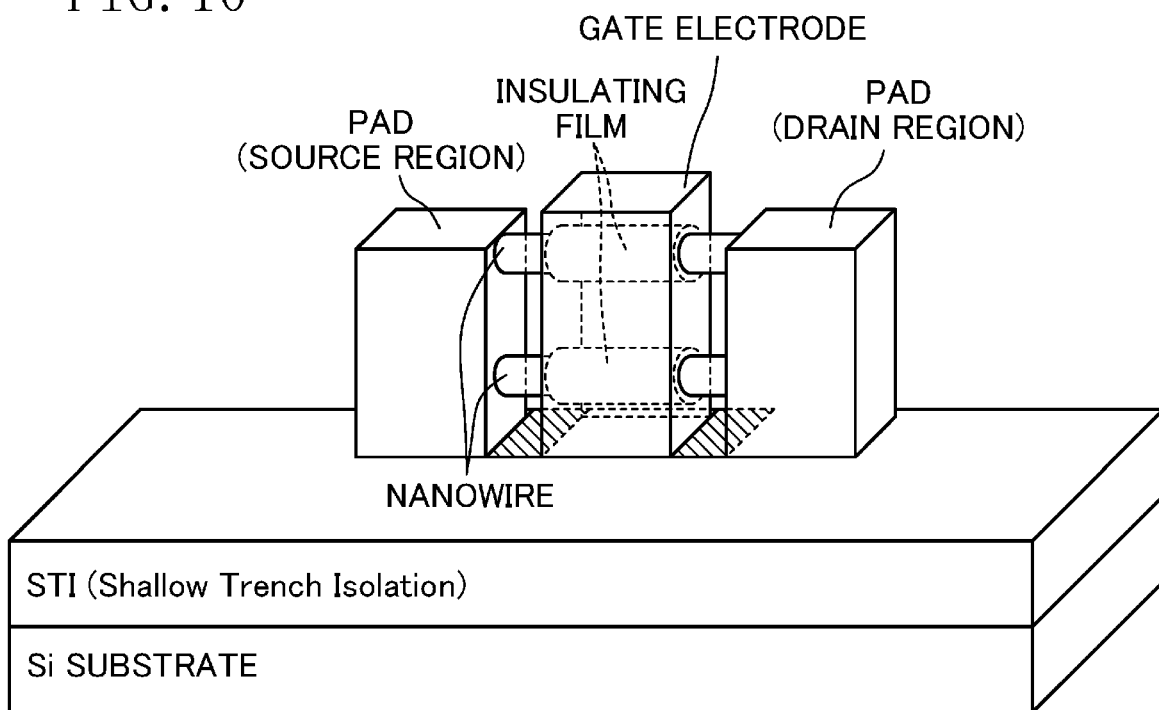
FIG. 10 is a schematic diagram of a basic structure of a nanowire FET.

FIG. 10 is a schematic diagram of a basic structure example of a nanowire FET (also referred to as a gate all around (GAA) structure). The nanowire FET is an FET including thin wires (nanowires) through which current passes. The nanowires are formed of silicon, for example. As illustrated in FIG. 10, the nanowires are formed above a substrate to extend in the horizontal direction, i.e., in parallel with the substrate, and each have two ends respectively connected to structures serving as a source region and a drain region of the nanowire FET. In the present specification, in the nanowire FET, the structures that are connected to both ends of the nanowires and serve as the source region and the drain region of the nanowire FET are referred to as pads. In FIG. 10, although a shallow trench isolation (STI) is formed on a silicon substrate, the silicon substrate is exposed under the nanowires (the hatched portions). Although the hatched portions may be covered with a thermally-oxidized film or any other film in practice, FIG. 10 does not illustrate such a film for the sake of simplicity.

The nanowires are surrounded by the gate electrode formed of polysilicon, for example, with an insulating film such as a silicon oxide film interposed therebetween. The pads and the gate electrode are formed on the surface of the substrate. With this structure, all of upper, lateral, and lower portions of channel regions of the nanowires are surrounded by the gate electrode, and an electric field is uniformly applied to the channel regions, thereby allowing the FET to have good switching characteristics.

Although at least portions of the pads connected to the nanowires serve as source/drain regions, portions thereof below the portions connected to the nanowires do not necessarily serve as the source/drain regions. Portions of the nanowires (portions not surrounded by the gate electrode) may serve as the source/drain regions.

In FIG. 10, two nanowires are arranged in the vertical direction, i.e., a direction perpendicular to the substrate. However, the number of the nanowires arranged in the vertical direction is not limited to two and may be one, three, or more. In FIG. 10, the upper end of the uppermost nanowire and the upper end of the pad are aligned. However, these upper ends do not need to be aligned; the upper end of the pad may be higher than the upper end of the uppermost nanowire.

Figure 11:
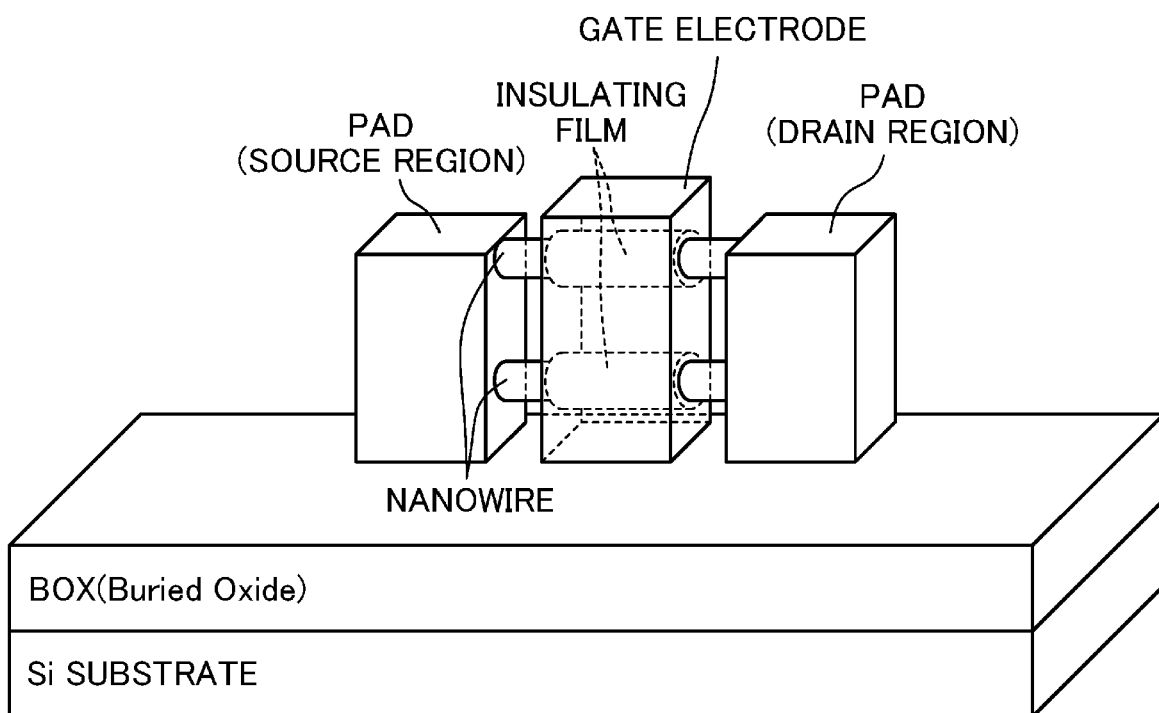
FIG. 11 is a schematic diagram of a basic structure of another nanowire FET.

As illustrated in FIG. 11, a buried oxide (BOX) may be formed on the upper face of the substrate, and the nanowire FET may be formed on this BOX.

A layout example of the circuit block of the semiconductor integrated circuit device according to the present embodiment is illustrated in the schematic plan view in FIG. 1.

Figure 5:
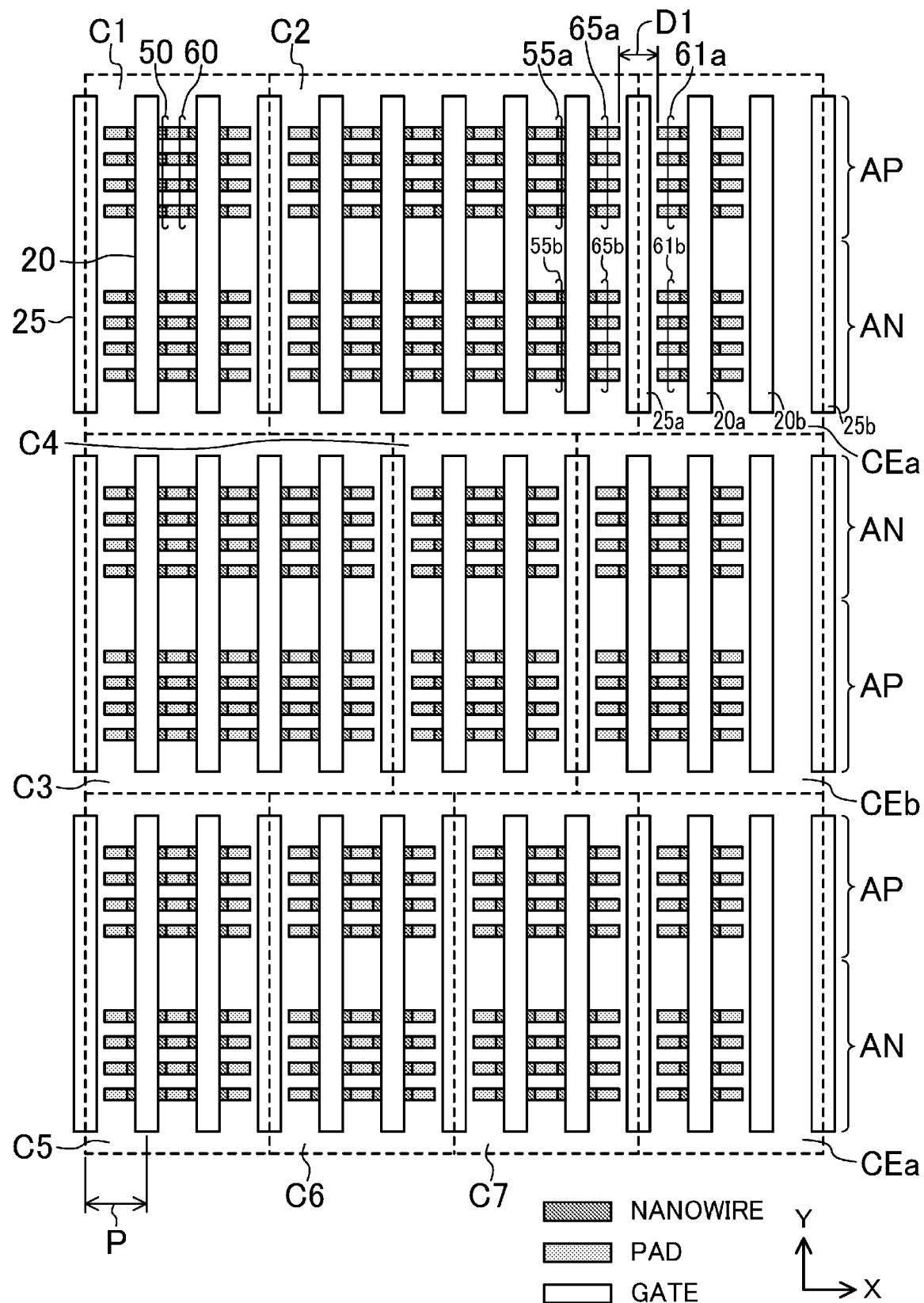
FIG. 5 is a partially enlarged view of FIG. 1 according to a second embodiment.

FIG. 5 is an enlarged view of a portion W of FIG. 1 according to the present embodiment. FIG. 5 illustrates nanowires 50, pads 60, and gate structures including gates 20 and dummy gates 25 in addition to cell frames (indicated by the broken line). However, other components such as a metal interconnect are not illustrated. In this example, the "dummy gate" refers to a gate that is not formed around the nanowires 50 and does not form any nanowire FETs. C1 to C7 are cells that contribute to the logical function of the circuit block 1. A cell row on the upper side of the drawing includes the cells C1 and C2, and a first cell-row-terminating cell CEa at its end on the right side of the drawing. A cell row at the center of the drawing includes the cells C3 and C4, and a second cell-row-terminating cell CEb at its end on the right side of the drawing. A cell row on the lower side of the drawing includes the cells C5 to C7, and a first cell-row-terminating cell CEa at its end on the right side of the drawing.

In FIG. 5, the nanowires 50 are arranged to extend in the X direction with the pads 60 provided on both sides thereof. The gates 20 and the dummy gates 25 are arranged to extend in the Y direction. The nanowires 50 and the gate 20 formed around the nanowires 50 form a nanowire FET. In each of the cell rows, AP is a P-type transistor area, whereas AN is an N-type transistor area. An upper portion of each of the first and third cell rows from the top is the P-type transistor area AP, whereas a lower portion thereof is the N-type transistor area AN. A lower portion of the second cell row from the top is the P-type transistor area AP, whereas an upper portion thereof is the N-type transistor area AN. In each of the P-type transistor area AP and the N-type transistor area AN, sets of eight of the nanowires 50 (four in a plan view and two in the vertical direction) are obtained, and the eight nanowires 50 are arranged side by side. The dummy gates 25 are arranged at the cell ends. The gate structures including the gates 20 and the dummy gates 25 are arranged at a uniform pitch P. The cell width of the first cell-row-terminating cell CEa is P×3, whereas the cell width of the second cell-row-terminating cell CEb is P×4.

Figure 6A:
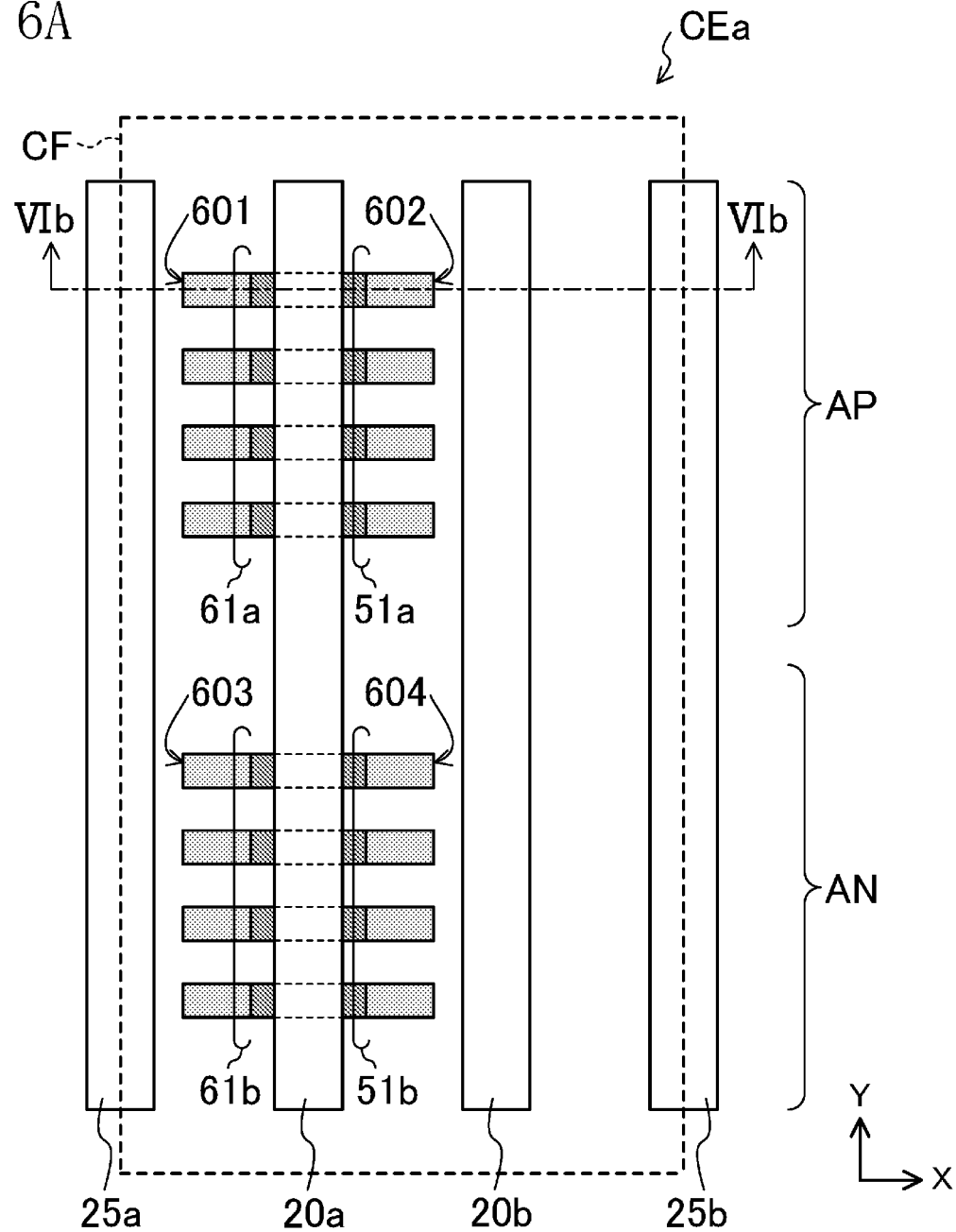
FIGS. 6A and 6B illustrate a configuration example of a cell-row-terminating cell of the second embodiment.
Figure 6B:
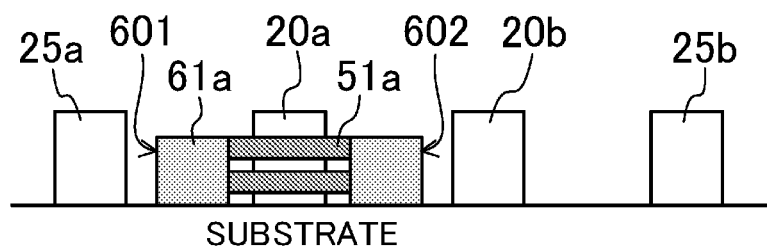
Figure 9:
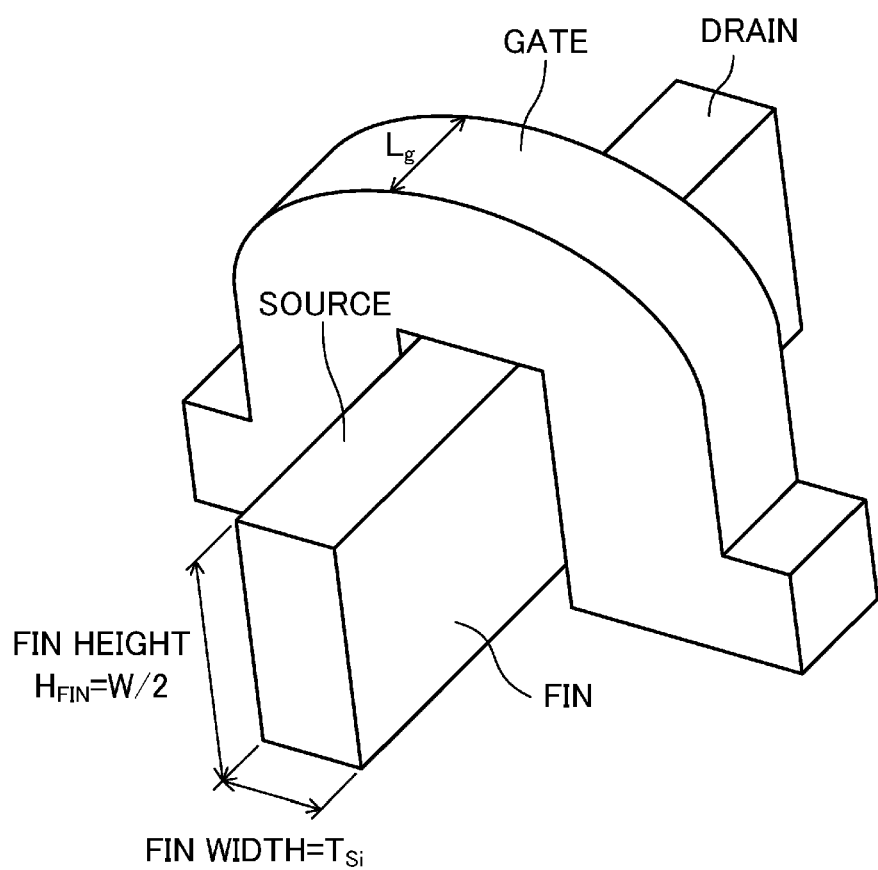
FIG. 9 is a schematic diagram of a general configuration of a fin structure transistor.

FIGS. 6A and 6B illustrate a configuration example of the first cell-row-terminating cell CEa. FIG. 6A is a plan view of a layout configuration thereof; and FIG. 6B is a cross-sectional view taken along line VIb-VIb shown in FIG. 6A. CF is a cell frame. The P-type transistor area AP includes eight (four in a plan view and two in the vertical direction) nanowires 51a with pads 61a formed on both sides thereof. The N-type transistor area AN includes eight (four in a plan view and two in the vertical direction) nanowires 51b with pads 61b formed on both sides thereof. Within the cell, the two gate structures 20a and 20b are formed, and the gate structures 25a and 25b as dummy gates are respectively formed at both cell ends in the X direction.

Here, ends 601 of the pads 61a on the left side of the drawing are located in front of the gate structure 25a, whereas ends 602 thereof on the right side of the drawing are located in front of the gate structure 20b. In other words, the ends 601 are near the gate structure 25a and do not overlap with the gate structure 25a in a plan view, and the ends 602 are near the gate structure 20b and do not overlap with the gate structure 20b in a plan view. Similarly, ends 603 of the pads 61b on the left side of the drawing are located in front of the gate structure 25a, whereas ends 604 thereof on the right side of the drawing are located in front of the gate structure 20b. In other words, the ends 603 are near the gate structure 25a and do not overlap with the gate structure 25a in a plan view, and the ends 604 are near the gate structure 20b and do not overlap with the gate structure 20b in a plan view. The first cell-row-terminating cell CEa is placed at the end of the cell row CR on the right side of the drawing as illustrated in FIGS. 1 and 2, and in FIGS. 6A and 6B, the left side of the drawing corresponds to the inner side of the circuit block 1, whereas the right side of the drawing corresponds to the outer side of the circuit block 1.

The second cell-row-terminating cell CEb has a larger cell width by one pitch P between the gate structures than the first cell-row-terminating cell CEa. However, its basic configuration is similar to that in FIGS. 6A and 6B.

Referring back to FIG. 5, in the cell row on the upper side of the drawing, the cell C2 is adjacent to the first cell-row-terminating cell CE on the left side of the drawing. The cell C2 includes a plurality of (eight in this example) nanowires 55a extending in the X direction and a plurality of pads 65a connected to the nanowires 55a in the P-type transistor area AP. The pads 65a face the respective pads 61a of the first cell-row-terminating cell CEa. The distances between the pads 65a and the facing pads 61a are equal. The cell C2 includes a plurality of (eight in this example) nanowires 55b extending in the X direction and a plurality of pads 65b connected to the nanowires 55b in the N-type transistor area AN. The pads 65b face the respective pads 61b of the first cell-row-terminating cell CEa. The distances between the pads 65b and the facing pads 61b are equal. The same applies to the relation between the cell C4 and the second cell-row-terminating cell CEb in the cell row at the center of the drawing and the relation between the cell C7 and the first cell-row-terminating cell CEa in the cell row on the lower side of the drawing.

Using the first cell-row-terminating cell CEa with the configuration illustrated in FIG. 6 can provide the following effect. Specifically, the ends 601 of the pads 61a and the ends 603 of the pads 61b of the first cell-row-terminating cell CEa on the inner side of the circuit block 1 are near the gate structure 25a placed at the cell end and do not overlap with the gate structure 25a in a plan view. With this configuration, the first cell-row-terminating cell CEa can be placed adjacent to the next cell C2 without having excessive space relative thereto, and the area of the circuit block 1 can thus be reduced to a lower degree.

FIGS. 7A and 7B illustrate other examples of the layout configuration of the cell-row-terminating cell and illustrate the configuration of the cell-row-terminating cell placed at the end of the cell row CR on the left side of the drawing. In FIGS. 7A and 7B, the left side of the drawing corresponds to the outer side of the circuit block 1, whereas the right side of the drawing corresponds to the inner side of the circuit block 1.

The configuration in FIG. 7A corresponds to a mirror image of the configuration in FIG. 6A. In other words, the P-type transistor area AP includes the eight (four in a plan view and two in the vertical direction) nanowires 51a with the pads 61a formed on both sides thereof. The N-type transistor area AN includes the eight (four in a plan view and two in the vertical direction) nanowires 51b with the pads 61b formed on both sides thereof. Within the cell, the two gate structures 20a and 20b are formed, and the gate structures 25a and 25b are formed at both cell ends in the X direction, respectively. The ends of the pads 61a and 61b on the right side of the drawing are located in front of the gate structure 25a, whereas the ends on the left side of the drawing are located in front of the gate structure 20b.

The configuration in FIG. 7B is obtained by increasing the cell width of the configuration in FIG. 7A by one pitch P between the gate structures. In other words, the P-type transistor area AP includes eight (four in a plan view and two in the vertical direction) nanowires 52a with pads 62a formed on both sides thereof. The N-type transistor area AN includes eight (four in a plan view and two in the vertical direction) nanowires 52b with pads 62b formed on both sides thereof. Within the cell, the three gate structures 21a, 21b, and 21c are formed, and the gate structures 26a and 26b are formed at both cell ends in the X direction, respectively. The ends of the pads 62a and 62b on the right side of the drawing are located in front of the gate structure 26a, whereas the ends on the left side of the drawing are located in front of the gate structure 21c.

In the present embodiment, as illustrated in FIG. 1, all the cell-row-terminating cells CE placed at the respective one ends of the cell rows CR do not have the same cell width, and include a plurality of kinds of cell-row-terminating cells CEa and CEb having different cell widths. Consequently, the position of a boundary between the cell-row-terminating cell CE and the next cell is not the same but shifts in the X direction. With this configuration, in a manufacturing process, narrow portions with no nanowire that are continuously arranged in the Y direction at the boundary between the cell-row-terminating cell CE and the next cell can be substantially prevented from being excessively long. Consequently, process-induced variations in nanowire FETs can be reduced.

As illustrated in FIG. 1, the second cell-row-terminating cells CEb each having a cell width that is different from that of the first cell-row-terminating cells CEa may be arranged at every certain number of cell rows (at every five rows, for example). With this configuration, the regularity of the layout increases, and process-induced variations can be further reduced. The second cell-row-terminating cells CEb do not necessarily have to be arranged at regular intervals.

In the first and second embodiments, two kinds of cells having cell widths that are respectively three times and four times the pitch P between the gate structures are used as the cell-row-terminating cells CE. However, this is merely an example of the present disclosure. Three or more kinds of cell-row-terminating cells having different cell widths may be used, or a cell-row-terminating cell having a cell width other than three times and four times the pitch P between the gate structures may be used, for example.

The internal configurations of the cell-row-terminating cells CE are not limited to those described in the first and second embodiments. FIGS. 8A and 8B are plan views of other examples of the layout configuration of the cell-row-terminating cell of the first embodiment, for example. While, in the configuration in FIG. 8A, the cell width is four times the pitch P between the gate structures, fins 13*a* and 13*b* are short, and the ends of the fins 13*a* and 13*b* on the right side of the drawing (the outer side of the circuit block) is located under a gate structure 21*b* at the center. While, in the configuration in FIG. 8B, the cell width is three times the pitch P between the gate structures, fins 14*a* and 14*b* are long, and the ends of the fins 14*a* and 14*b* on the right side of the drawing (the outer side of the circuit block) are under the gate structure 25*b* at a cell end and overlap with the gate structure 25*b* in a plan view.

In the first and second embodiments, in the circuit block 1, the cell rows CR each include the cell-row-terminating cells CE at respective ends thereof. However, this is merely an example of the present disclosure. Only one end portion of each cell row CR may include the cell-row-terminating cell CE, or some of the cell rows CR do not necessarily have to include any cell-row-terminating cells CE, for example. In other words, at least one of the cell rows CR may include, at at least one end thereof, the cell-row-terminating cell CE described above.

In the first and second embodiments, the circuit block 1 has a rectangular outer shape, and while first ends of the cell rows CR in the X direction are aligned, second ends of the cell rows CR in the X direction are aligned. However, this is merely an example of the present disclosure. The circuit block may be L-shaped, for example. In this case, the circuit block may include a rectangular area including a plurality of cell rows each having a first end and a second end, the first ends of the cell rows in the first direction being aligned, the second ends of the cell rows in the first direction being aligned. One end portion of each of the cell rows in this rectangular area may include a plurality of kinds of cell-row-terminating cells having different cell widths. With this configuration, process-induced variations in fin shape or nanowire FETs can be reduced just like the first and second embodiments. In the first and second embodiments, the entire circuit block 1 corresponds to this rectangular area.

On the side of the circuit block 1 on which the cell-row-terminating cells CE are arranged, another circuit block may be adjacent to the circuit block 1. In this case, cell-row-terminating cells are preferably arranged at an end of the other circuit block as well.

The present disclosure can stabilize transistor characteristics while reducing process-induced variations at cell row ends of a circuit block in a semiconductor integrated circuit device including standard cells including fin transistors or nanowire FETs. Thus, the present disclosure is useful for improving the performance of the semiconductor integrated circuit device.

What is claimed is:

1. A semiconductor integrated circuit device comprising a circuit block having first and second cell rows each having a plurality of cells arranged in a first direction, the first and second cell rows being arranged in a second direction perpendicular to the first direction, wherein the first cell row includes a first cell-row-terminating cell that does not contribute to a logical function of the circuit block at a first end thereof, and the second row includes a second cell-row-terminating cell that does not contribute to a logical function of the circuit block at a second end thereof, the first end of the first cell row and the second end of the second cell row being at the same position in the first direction, a first cell is adjacent to the first cell-row-terminating cell in the first direction, and a second cell is adjacent to the second cell-row-terminating cell in the first direction, the first and second cell-row-terminating cells each include:

a plurality of fins extending in the first direction; and a plurality of gate structures extending in the second direction and including a first gate structure placed at a cell end on an inner side of the circuit block, and the first and second cells each include:

a plurality of fins extending in the first direction, the plurality of fins of the first cell facing the plurality of fins of the first cell-row-terminating cells, respectively, and the plurality of fins of the second cell facing the plurality of fins of the second cell-row-terminating cells, respectively, the first and second cell-row-terminating cells have cell width different from each other, the cell width being a cell dimension in the first direction.

2. The semiconductor integrated device of claim 1, wherein a first distance in the first direction between the plurality of fins of the first cell-row terminating cell and the plurality of fins of the first cell is the same as a second distance in the first direction between the plurality of fins of the second cell-row terminating cell and the plurality of fins of the second cell.

3. The semiconductor integrated device of claim 1, wherein end of the plurality of fins on the inner side of the circuit block of the first and second cell-row-terminating cells do not overlap with the first gate structure in a plan view.

4. The semiconductor integrated device of claim 3, wherein
end of the plurality of fins on an outer side of the circuit block of the first and second cell-row-terminating cells overlap with any one of the gate structures other than the first gate structure in a plan view.

5. The semiconductor integrated device of claim 4, wherein
the any one of the gate structures is a second gate structure placed at a cell end on the outer side of the circuit block.

6. The semiconductor integrated device of claim 1, wherein
end of the plurality of fins on an outer side of the circuit block of the first and second cell-row-terminating cells overlap with any one of the gate structures other than the first gate structure in a plan view.

7. The semiconductor integrated device of claim 6, wherein
the any one of the gate structures is a second gate structure placed at a cell end on the outer side of the circuit block.

8. A semiconductor integrated circuit device comprising
a circuit block having first and second cell rows each having a plurality of cells arranged in a first direction, the first and second cell rows being arranged in a second direction perpendicular to the first direction, wherein
the first cell row includes a first cell-row-terminating cell that does not contribute to a logical function of the circuit block at a first end thereof, and the second row includes a second cell-row-terminating cell that does not contribute to a logical function of the circuit block at a second end thereof, the first end of the first cell row and the second end of the second cell row being at the same position in the first direction,
a first cell is adjacent to the first cell-row-terminating cell in the first direction, and a second cell is adjacent to the second cell-row-terminating cell in the first direction,
the first and second cell-row-terminating cells each include:
a plurality of fins extending in the first direction; and
a plurality of gate structures extending in the second direction and including a first gate structure placed at a cell end on an inner side of the circuit block, and a second gate structure adjacent to the first gate structure in the first direction, and
the first and second cells each include:
a plurality of fins extending in the first direction, the plurality of fins of the first cell facing the plurality of fins of the first cell-row-terminating cells, respectively, and the plurality of fins of the second cell facing the plurality of fins of the second cell-row-terminating cells, respectively, and
a third gate structure adjacent to the first gate structure in the first direction,
the first and second cell-row-terminating cells have cell width different from each other, the cell width being a cell dimension in the first direction,
the plurality of fins of the first and second cell-row-terminating cells are at least partly between the first gate structure and the second gate structure,
the plurality of fins of the first and second cells are at least partly between the first gate structure and the third gate structure.

9. The semiconductor integrated device of claim 8, wherein
a first distance in the first direction between the plurality of fins of the first cell-row terminating cell and the plurality of fins of the first cell is the same as a second distance in the first direction between the plurality of fins of the second cell-row terminating cell and the plurality of fins of the second cell.

10. The semiconductor integrated device of claim 8, wherein
end of the plurality of fins on an outer side of the circuit block of the first and second cell-row-terminating cells overlap with any one of the gate structures other than the first gate structure in a plan view.

11. The semiconductor integrated device of claim 10, wherein
the any one of the gate structures is a fourth gate structure placed at a cell end on the outer side of the circuit block.

* * * * *